United States Patent
Saito

(10) Patent No.: US 10,076,069 B2
(45) Date of Patent: Sep. 11, 2018

(54) ELECTRONIC CIRCUIT MODULE

(71) Applicant: ALPS ELECTRIC CO., LTD., Tokyo (JP)

(72) Inventor: Tatsuo Saito, Miyagi-ker (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/390,072

(22) Filed: Dec. 23, 2016

(65) Prior Publication Data

US 2017/0202115 A1    Jul. 13, 2017

(30) Foreign Application Priority Data

Jan. 7, 2016 (JP) .................................. 2016-001565

(51) Int. Cl.
*H05K 9/00* (2006.01)
*H05K 3/30* (2006.01)
*H05K 1/02* (2006.01)

(52) U.S. Cl.
CPC ......... *H05K 9/0028* (2013.01); *H05K 1/0216* (2013.01); *H05K 3/30* (2013.01); *H05K 2201/0715* (2013.01); *H05K 2201/10371* (2013.01)

(58) Field of Classification Search
CPC .................................................. H05K 9/0028
USPC ....................................................... 361/752
See application file for complete search history.

(56) References Cited

U.S. PATENT DOCUMENTS

| 9,247,682 | B2 * | 1/2016 | Watanabe | H05K 9/0043 |
| 2008/0043453 | A1 * | 2/2008 | Horng | H05K 9/0028 361/818 |
| 2008/0192446 | A1 * | 8/2008 | Hankofer | H05K 3/301 361/752 |
| 2012/0218727 | A1 * | 8/2012 | Kim | H05K 9/0028 361/767 |
| 2013/0176684 | A1 * | 7/2013 | Moore, Jr. | H05K 9/0026 361/720 |
| 2013/0329381 | A1 * | 12/2013 | Huang | H05K 9/0028 361/748 |
| 2015/0014049 | A1 * | 1/2015 | Jang | H05K 9/0028 174/377 |
| 2015/0181773 | A1 * | 6/2015 | Ueda | H05K 9/0028 361/818 |

\* cited by examiner

*Primary Examiner* — Hoa C Nguyen
*Assistant Examiner* — Stanley Tso
(74) *Attorney, Agent, or Firm* — Brinks Gilson & Lione

(57) ABSTRACT

An electronic circuit module includes a circuit board and a metal cover. The metal cover includes a top plate and attachment legs. Electrode lands are provided on the circuit board, each of the electrode lands being joined to a corresponding one of the attachment legs. Each of the attachment legs includes a fixing portion joined to a corresponding one of the electrode lands, an insertion portion that extends so as to project from the fixing portion, a clearance portion provided near a base of the insertion portion, and a contact portion that is in contact with a surface of the circuit board. An insertion hole in which the insertion portion is inserted is provided in each of the electrode lands and in the circuit board, and the circuit board includes a non-electrode portion at a location at which the contact portion is in contact with the circuit board.

3 Claims, 14 Drawing Sheets

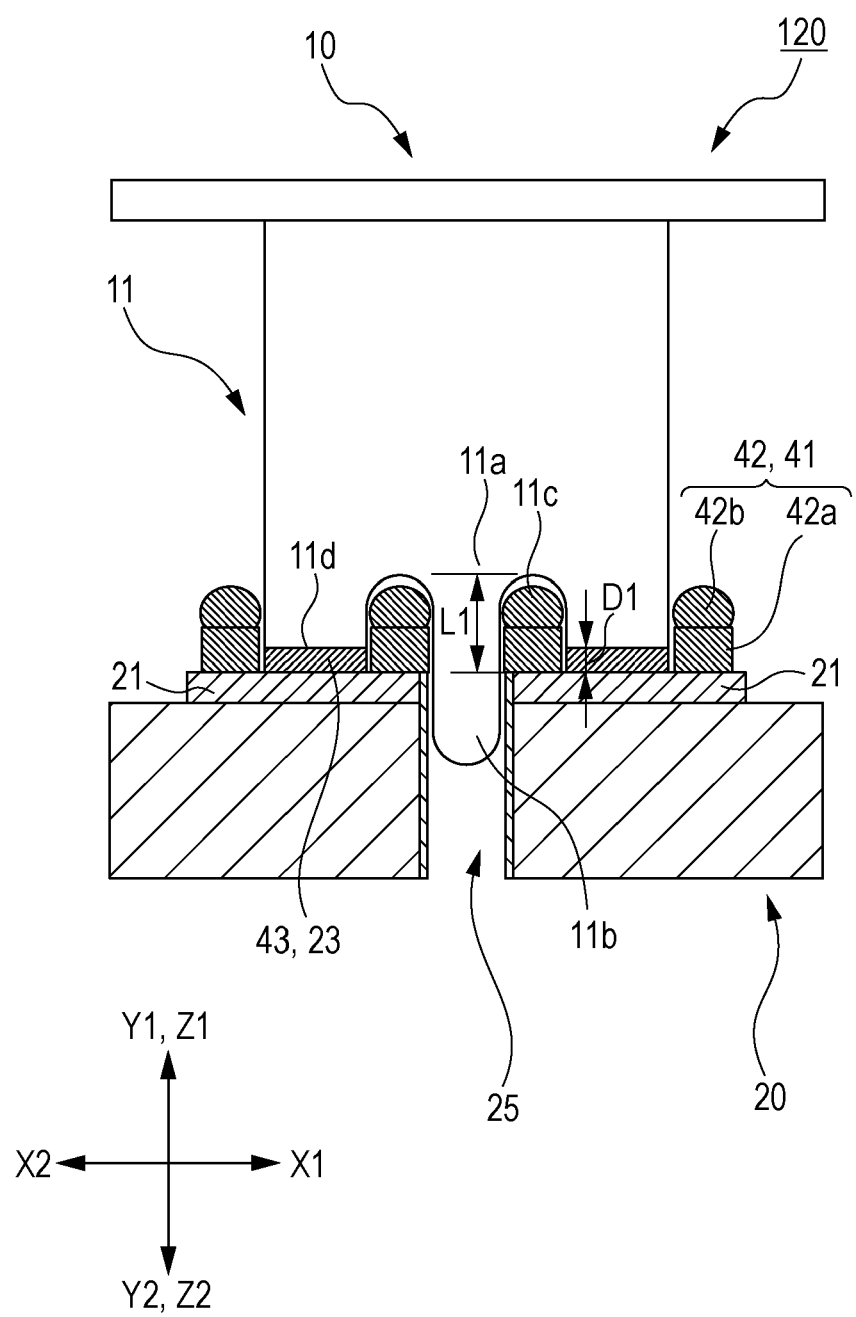

ELECTRONIC CIRCUIT MODULE

CLAIM OF PRIORITY

This application claims benefit of priority to Japanese Patent Application No. 2016-001565 filed on Jan. 7, 2016, which is hereby incorporated by reference in its entirety.

BACKGROUND

1. Field of the Disclosure

The present disclosure relates to electronic circuit modules, and more particularly, to an electronic circuit module to which a metal cover is attached and a cover-fixing method for an electronic circuit module.

2. Description of the Related Art

A known electronic circuit module includes a circuit board on which a plurality of electronic components are mounted and a metal cover attached to the circuit board so as to cover the electronic components. Japanese Unexamined Patent Application Publication No. 2014-033025 discloses such an electronic circuit module. FIGS. 13 and 14A illustrates an electronic circuit module 900 disclosed in Japanese Unexamined Patent Application Publication No. 2014-033025.

As illustrated in FIG. 13, the electronic circuit module 900 includes a circuit board 920 on which electronic components 910 are mounted and a metal cover 930 that covers the circuit board 920. The metal cover 930 includes a top plate 931 that opposes the circuit board 920, a plurality of side plates 932, and a plurality of attachment legs 933. The circuit board 920 includes a plurality of lands 921 to which the attachment legs 933 are joined. As illustrated in FIG. 14A, each attachment leg 933 includes a bent portion 933a located at the outer periphery of the top plate 931 of the metal cover 930, an attachment-leg bent portion 933b, an attachment-leg fixing portion 933c that is in contact with the corresponding land 921 on the circuit board 920, and an attachment-leg insertion portion 933d. When the electronic circuit module 900 is viewed from above the circuit board 920, the bent portion 933a is located inside the attachment-leg fixing portion 933c, and the width of the bent portion 933a is greater than the width of the attachment-leg fixing portion 933c.

The above-described structure has an effect of preventing the metal cover 930 from being deformed when the thickness of the metal cover 930 is reduced.

However, since the metal cover 930 of the electronic circuit module 900 is formed into a predetermined shape by a punching process, the base portion of the attachment-leg insertion portion 933d illustrated in FIG. 14A is not perfectly perpendicular. Therefore, there is a possibility that rising of the metal cover 930 will occur when the attachment leg 933 is inserted in an insertion hole. To prevent this, arc-shaped clearance portions 933e shown by the dashed lines in FIG. 14B may be formed in the base portion of the attachment-leg insertion portion 933d. However, when the arc-shaped clearance portions 933e are formed, gaps are formed between the arc-shaped clearance portions 933e and the land 921. Therefore, there is a risk that pin holes will be formed at the gaps during the joining process using a joining material, such as solder, and it is difficult to obtain a predetermined joining strength.

SUMMARY

An electronic circuit module includes a circuit board on which an electronic component is mounted, and a metal cover that covers the circuit board. The metal cover includes a top plate that opposes the circuit board, and a plurality of attachment legs that extend from the top plate and that are joined to the circuit board. A plurality of electrode lands are provided on the circuit board, each of the electrode lands being joined to a corresponding one of the attachment legs. Each of the attachment legs includes a fixing portion joined to a corresponding one of the electrode lands, an insertion portion that extends so as to project from the fixing portion, a clearance portion provided near a base of the insertion portion, and a contact portion that is in contact with a surface of the circuit board. An insertion hole in which the insertion portion is inserted is provided in each of the electrode lands and in the circuit board. The circuit board includes a non-electrode portion at a location at which the contact portion is in contact with the circuit board.

According to the electronic circuit module having the above-described structure, since each attachment leg includes the clearance portion, rising of the metal cover can be prevented. In addition, when the non-electrode portion is provided at the location at which each attachment leg comes into contact with the corresponding electrode land and a joining material layer is formed on the electrode land, a gap in the clearance portion can be reduced in size and can be filled with the joining material that forms the joining material layer. Therefore, the occurrence of pin holes can be reduced when the metal cover and the circuit board are joined together. As a result, the metal cover can be fixed to the circuit board with predetermined joining strength.

A disclosed cover-fixing method for an electronic circuit module is a method by which a metal cover, which covers a circuit board on which an electronic component is mounted, is fixed to the circuit board. The metal cover includes a top plate that opposes the circuit board, and a plurality of attachment legs that extend from the top plate and that are to be joined to the circuit board. A plurality of electrode lands, each of which is to be joined to a corresponding one of the attachment legs, are provided on the circuit board. Each of the attachment legs includes a fixing portion to be joined to a corresponding one of the electrode lands, an insertion portion that extends so as to project from the fixing portion, a clearance portion provided near a base of the insertion portion, and a contact portion that comes into contact with a surface of the circuit board. an insertion hole in which the insertion portion is to be inserted is provided in each of the electrode lands and in the circuit board. The circuit board includes a non-electrode portion at a location at which the contact portion comes into contact with the circuit board. The cover-fixing method includes forming a joining material layer on a component land for the electronic component and mounting the electronic component; attaching the metal cover to the circuit board while inserting the insertion portion into the insertion hole after the joining material layer is formed and the electronic component is mounted; and joining the fixing portion to a corresponding one of the electrode lands by using a joining material.

According to the cover-fixing method for the electronic circuit module having the above-described structure, since each attachment leg includes the clearance portion, rising of the metal cover can be prevented. In addition, when the non-electrode portion is provided at the location at which each attachment leg comes into contact with the corresponding electrode land and the joining material layer is formed on the electrode land, a gap in the clearance portion can be reduced in size and can be filled with the joining material that forms the joining material layer. Therefore, the occurrence of pin holes can be reduced when the metal cover and the circuit board are joined together. As a result, the metal cover can be fixed to the circuit board with predetermined joining strength.

BRIEF DESCRIPTION OF THE DRAWINGS

FIG. 8 is an enlarged schematic view of the electronic circuit module according to the second modification after an application of a joining material;

DESCRIPTION OF THE EXEMPLARY EMBODIMENTS

Embodiment of Electronic Circuit Module

An embodiment of an electronic circuit module according to the present invention will be described with reference to the drawings. The electronic circuit module is, for example, a small electronic circuit module that includes a high frequency circuit for a wireless local area network (LAN) or the like and to which a metal cover is attached. The use of the electronic circuit module according to the present invention is not limited to this, and may be changed as appropriate. In this specification, it is assumed that the X1-side in each figure is the right side, the X2-side is the left side, the Y1-side is the rear side, the Y2-side is the front side, the Z1-side is the upper side, and the Z2-side is the lower side unless otherwise specified.

Figure 1:
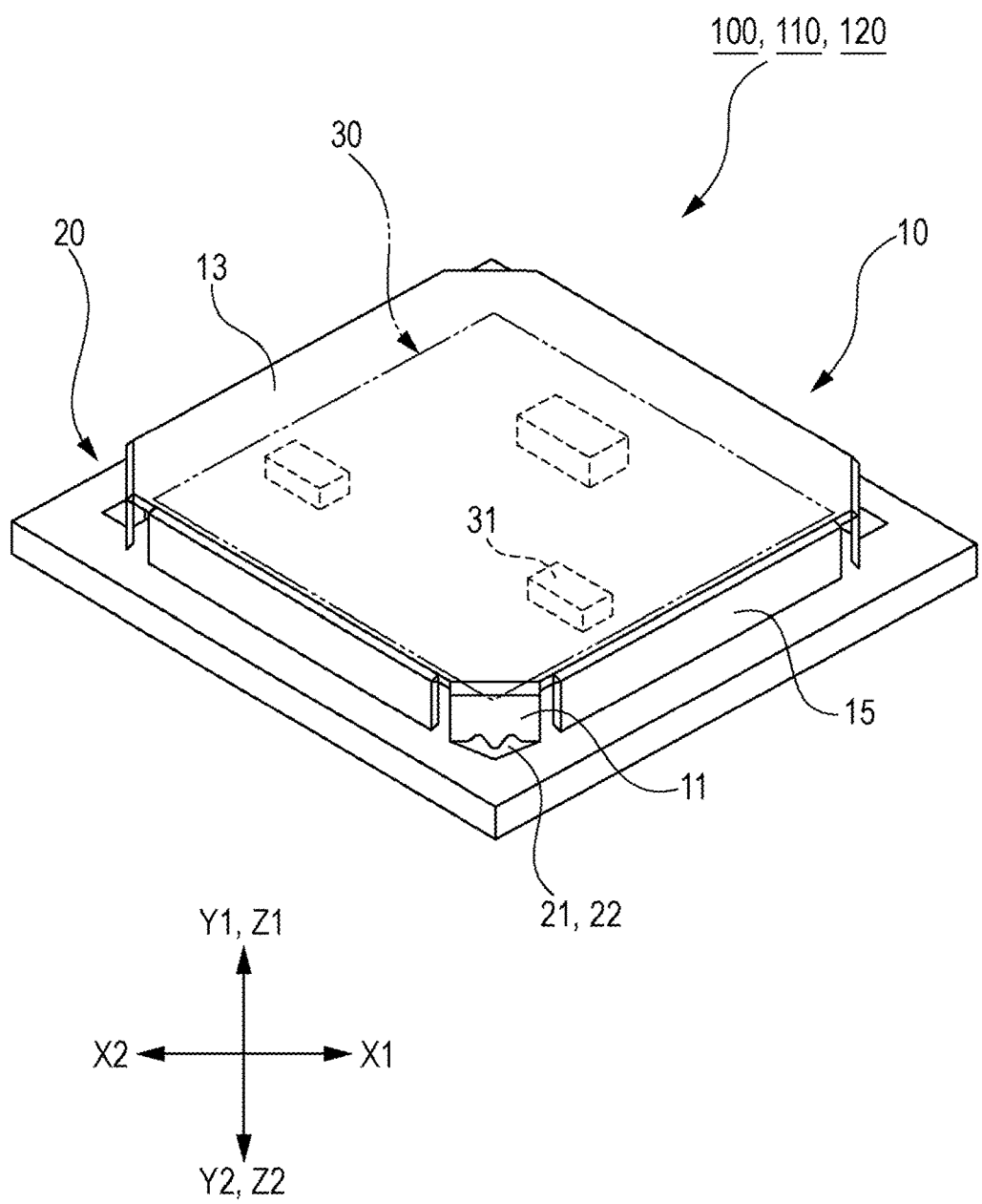
FIG. 1 is a perspective view illustrating the external appearance of an electronic circuit module according to an embodiment the present invention.
Figure 2:
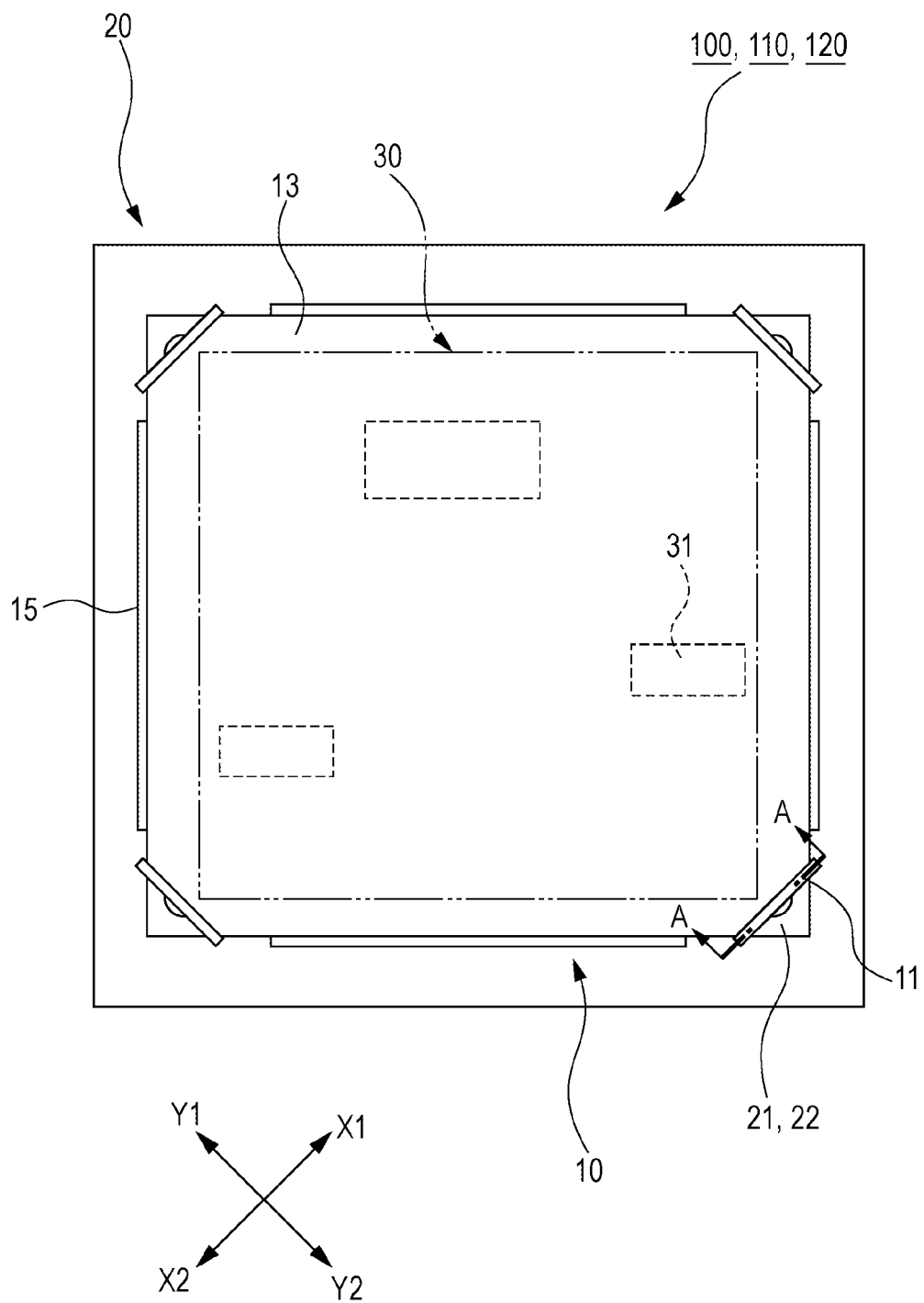
FIG. 2 is a plan view of the electronic circuit module.
Figure 3:
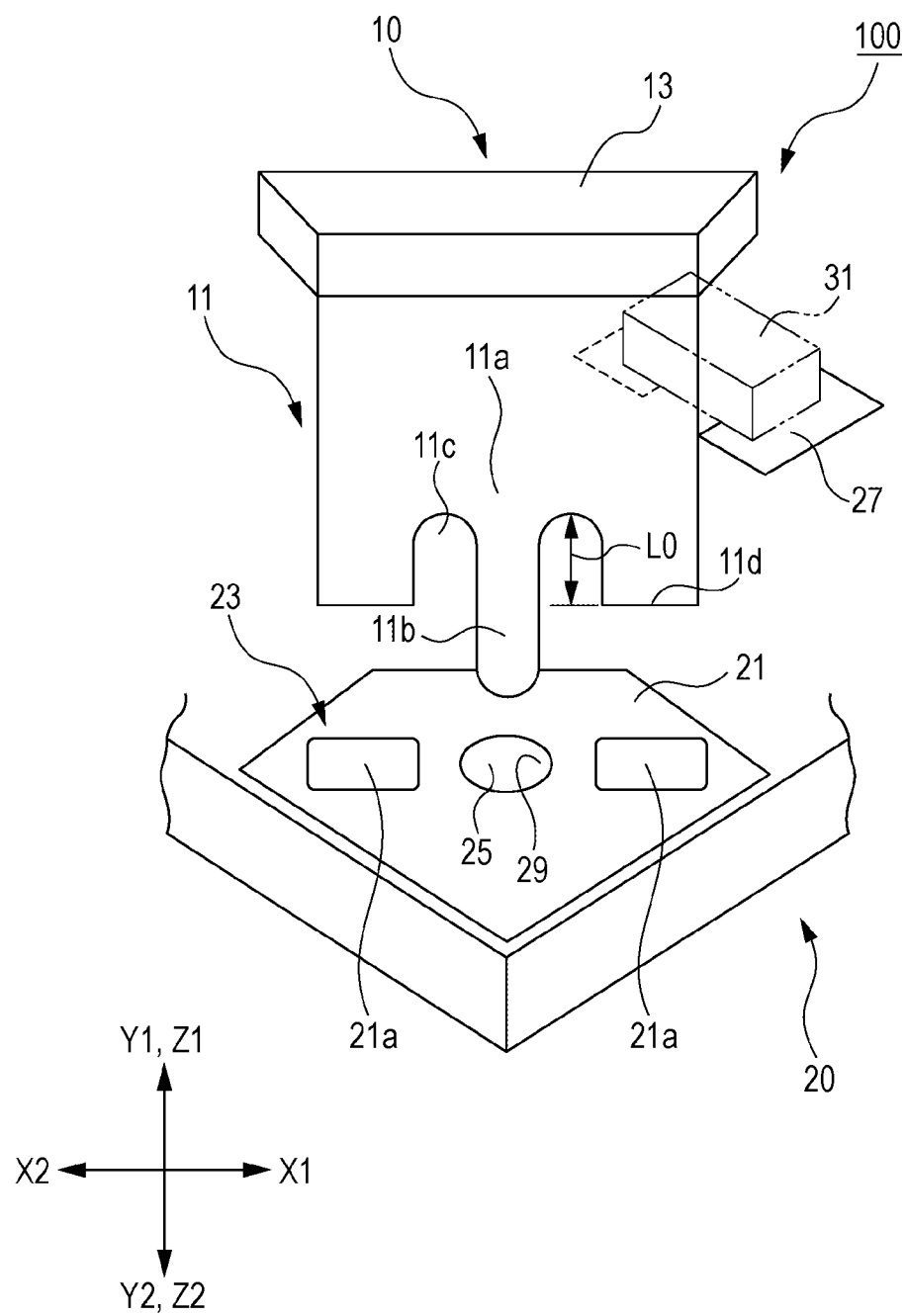
FIG. 3 is an enlarged schematic view of the electronic circuit module.
Figure 4:
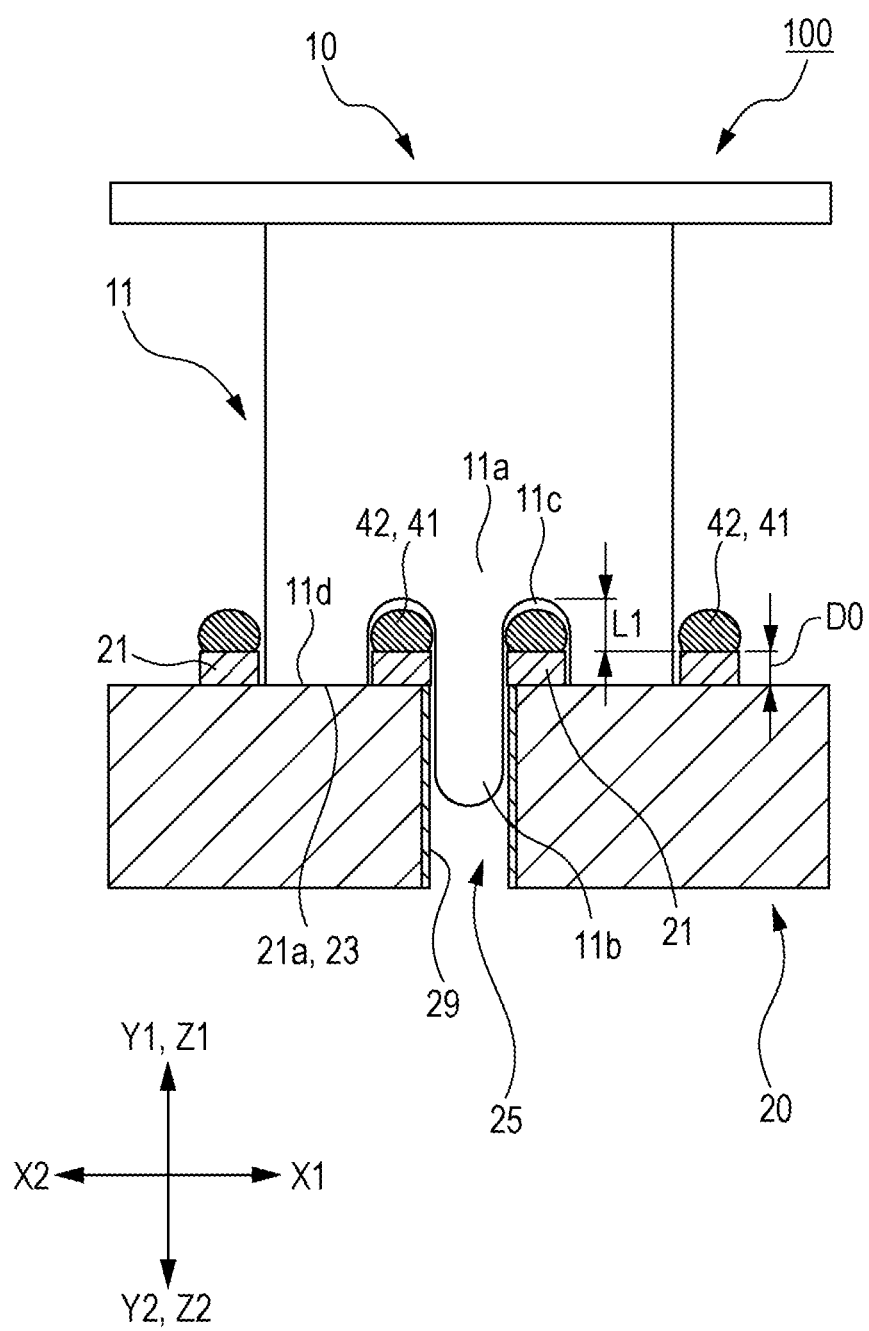
FIG. 4 is an enlarged schematic view of the electronic circuit module after an application of a joining material.

The structure of an electronic circuit module 100 will be described with reference to FIGS. 1 to 4. FIG. 1 is a perspective view illustrating the external appearance of the electronic circuit module 100, and FIG. 2 is a plan view of the electronic circuit module 100. FIG. 3 is an enlarged schematic view of the electronic circuit module 100 viewed from the front. FIG. 4 is an enlarged schematic view of the electronic circuit module 100 viewed along line A-A in FIG. 2 in the state after a joining material 41 is applied. FIG. 3 illustrates the state before a metal cover 10 is attached to a circuit board 20 to dearly show each component. This also applies to FIGS. 5 and 7, which will be described below.

As illustrated in FIGS. 1 and 2, the electronic circuit module 100 includes the circuit board 20 on which a plurality of electronic components 31 are mounted and the metal cover 10 that covers the circuit board 20. An electronic circuit 30, such as a high frequency circuit, including the electronic components 31 and wiring patterns (not shown) is formed on the circuit board 20.

The metal cover 10 includes a top plate 13 that opposes the circuit board 20; a plurality of attachment legs 11 that extend downward from the four corners of the top plate 13 and that are joined to the circuit board 20; and a plurality of side plates 15 that extend downward from the top plate 13 so as to surround the electronic circuit 30 at fourth sides thereof. The metal cover 10 is provided to block unnecessary external radio waves and to prevent leakage of radio waves from the electronic circuit 30 to the outside.

Referring to FIG. 3, component lands 27 to which the electronic components 31 are joined are provided on the circuit board 20. In addition, as illustrated in FIGS. 1 to 3, a plurality of electrode lands 21 are provided, each electrode land 21 being joined to the corresponding one of the attachment legs 11 of the cover 10. The electrode lands 21 are located near the four corners of the circuit board 20 so that the metal cover 10 can be joined to the electrode lands 21 at the four corners thereof. As illustrated in FIG. 4, the thickness of each electrode land 21 in the up-down direction is set to an electrode-land thickness D0.

As illustrated in FIG. 3, each attachment leg 11 includes a fixing portion 11a that is joined to the corresponding electrode land 21; an insertion portion 11b that extends so as to project from the fixing portion 11a; clearance portions 11c provided near the base of the insertion portion 11b; and contact portions 11d that come into contact with a surface of the circuit board 20.

The insertion portion 11b projects downward beyond the lower ends of the contact portions 11d. The clearance portions 11c are arc-shaped spaces provided at the bottom of the fixing portion 11a. Two clearance portions 11c are provided for each attachment leg 11. The clearance portions 11c have a space length L0 in the up-down direction. The space length L0 of the clearance portions 11c is the distance from the contact portions 11d to the centers of the arcs. The clearance portions 11c are provided to prevent rising of the metal cover 10 from the circuit board 20 when the metal cover 10 is joined to the circuit board 20.

An insertion hole 25 in which the insertion portion 11b of the attachment leg 11 is inserted is formed in the electrode land 21 and the circuit board 20. The insertion hole 25 has a diameter that is slightly greater than the width of the insertion portion 11b of the attachment leg 11. The insertion hole 25 is a via hole, and a via land 29 may be formed on the inner wall of the insertion hole 25. The joining strength between the metal cover 10 and the circuit board 20 can be increased by forming the via land 29 on the inner wall of the insertion hole 25.

The circuit board 20 includes non-electrode portions 23 at locations at which the contact portions 11d of the attachment leg 11 come into contact with the circuit board 20. The non-electrode portions 23 are provided so that the attachment leg 11 of the metal cover 10 does not come into contact with the electrode land 21 when the attachment leg 11 is attached to the circuit board 20.

As illustrated in FIG. 3, in the electronic circuit module 100, the non-electrode portions 23 are formed by forming electrode-free portions 21a in the electrode land 21, the electrode-free portions 21a being portions in which the electrode land 21 is absent. The electrode-free portions 21a are provided in the electrode land 21 at locations at which the contact portions 11d of the attachment leg 11 are placed. Therefore, the contact portions 11d of the attachment leg 11 do not come into contact with a surface of the electrode land 21 but directly come into contact with a surface of the circuit board 20.

The electrode-free portions 21a, in which the electrode land 21 is absent, are formed as the non-electrode portions 23 in the electrode land 21. Therefore, as illustrated in FIG. 4, the contact portions 11d of the attachment leg 11 are located below the surface of the electrode land 21 by a distance corresponding to the electrode-land thickness D0 of the electrode land 21.

When the metal cover 10 is attached to the circuit board 20, as illustrated in FIG. 4, the joining material 41 is applied to the electrode land 21 so that a joining material layer 42 is formed. If the contact portions 11d of the attachment leg 11 were placed on the surface of the electrode land 21, the space length of the clearance portions 11c of the attachment leg 11 in the up-down direction would remain equal to the space length L0 illustrated in FIG. 3. However, in the electronic circuit module 100, since the contact portions 11d of the attachment leg 11 are directly in contact with the surface of the circuit board 20, the space length L1 of the clearance portions 11c of the attachment leg 11 in the region above the electrode land 21 is shorter than the space length L0 illustrated in FIG. 3 by the electrode-land thickness D0 of the electrode land 21.

Therefore, the spaces in the clearance portions 11c that are above the surface of the electrode land 21 and that have the space length L1 are filled with the joining material layer 42, and substantially no gaps remain therein. As a result, no pin holes are formed when the metal cover 10 is joined to the circuit board 20.

First Modification of Electronic Circuit Module

Figure 5:
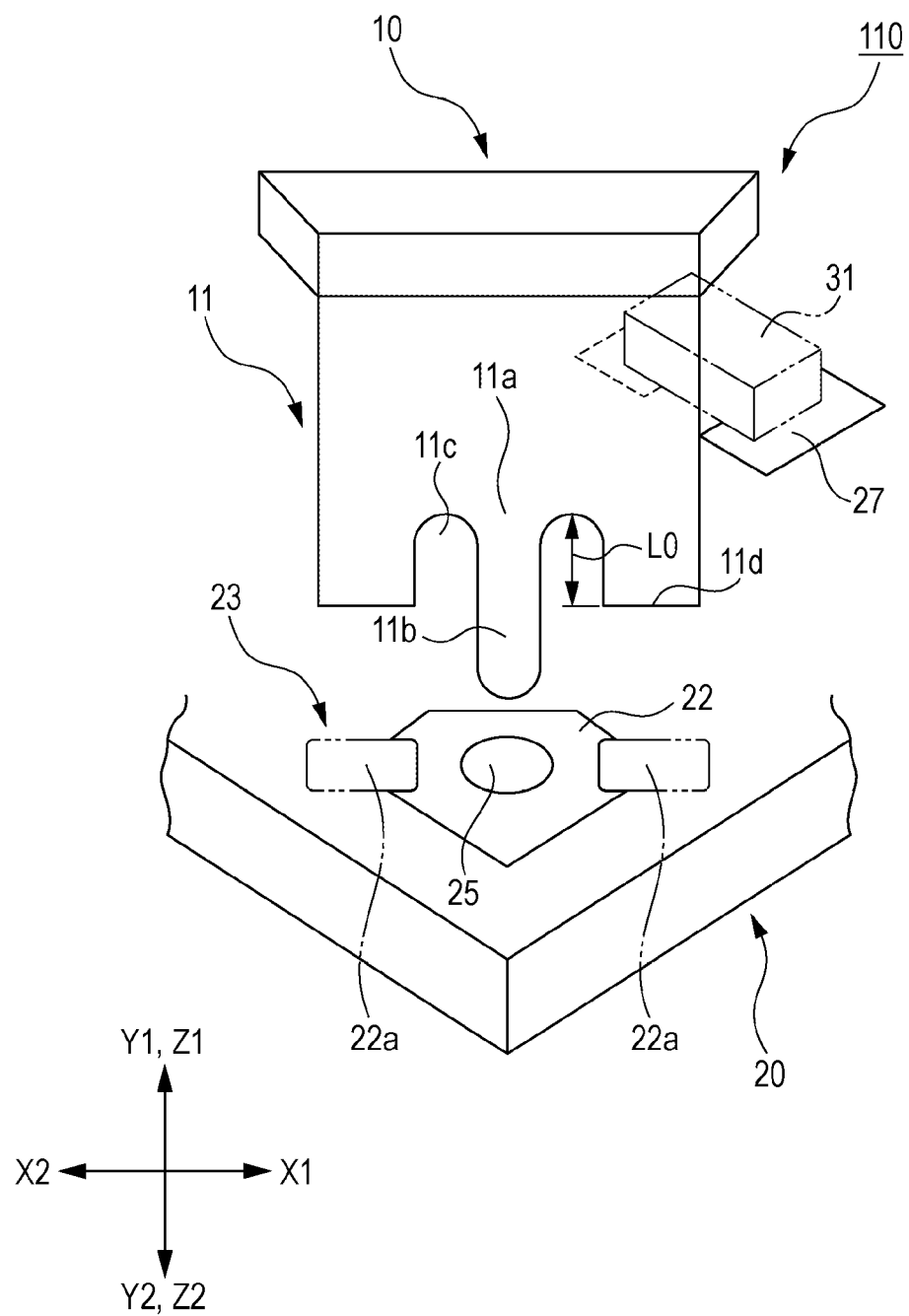
FIG. 5 is an enlarged schematic view of an electronic circuit module according to a first modification.
Figure 6:
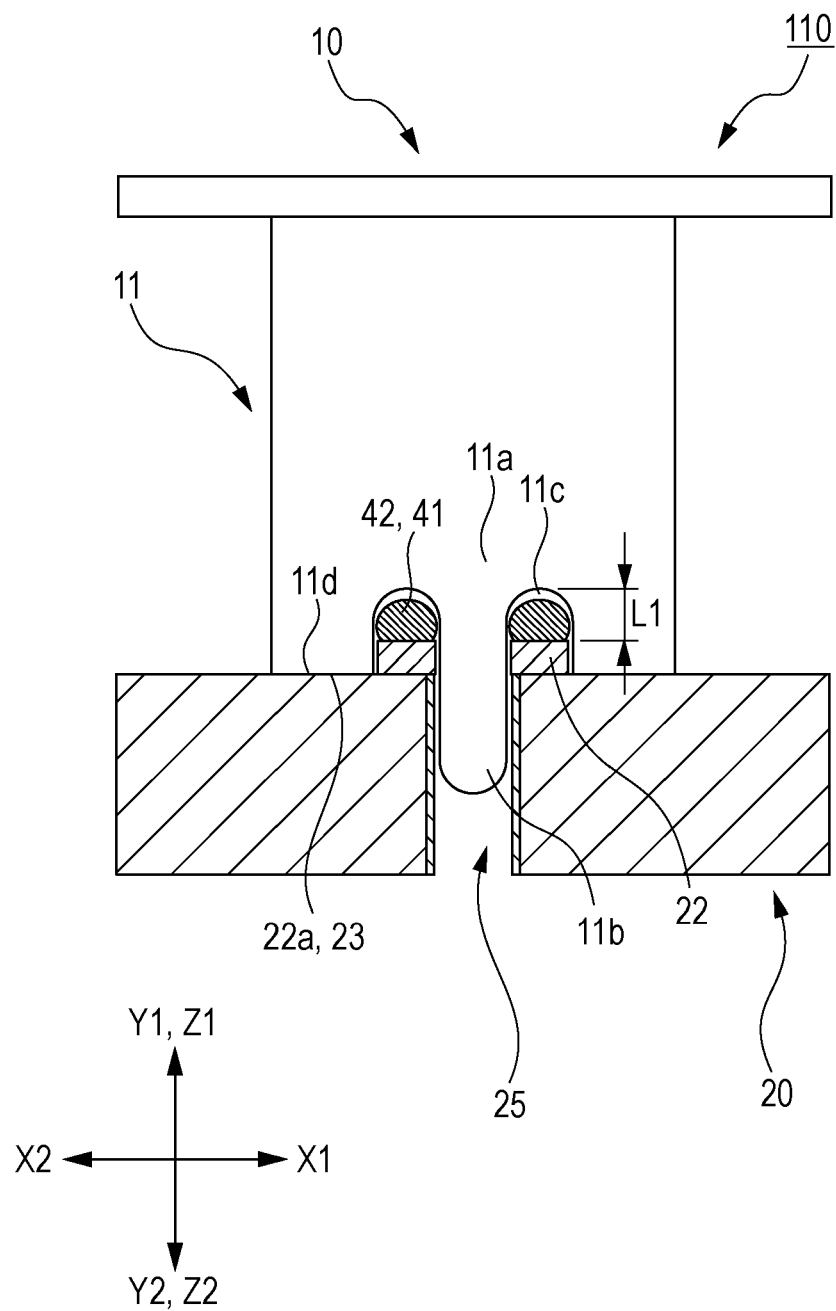
FIG. 6 is an enlarged schematic view of the electronic circuit module according to the first modification after an application of a joining material.

The structure of an electronic circuit module 110 will be described with reference to FIGS. 1, 2, 5, and 6. The electronic circuit module 110 is a first modification of the above-described electronic circuit module 100. FIG. 5 is an enlarged schematic view of the electronic circuit module 110, and FIG. 6 is an enlarged schematic view of the electronic circuit module 110 viewed along line A-A in FIG. 2 in the state after the joining material 41 is applied.

The only difference between the structure of the electronic circuit module 110 and the structure of the electronic circuit module 100 is the structure of electrode lands 22. Therefore, the description of the components other than the electrode lands 22 will be omitted. The components other than the electrode lands 22 are denoted by the same reference numerals as the components of the electronic circuit module 100.

Referring to FIGS. 1 and 2, the electrode lands 22 are provided on the circuit board 20, each electrode land 22 being joined to the corresponding one of the attachment legs 11 of the cover 10. The electrode lands 22 are located near the four corners of the circuit board 20 so that the metal cover 10 can be joined to the electrode lands 22 at the four corners thereof.

Referring to FIG. 5, the insertion hole 25, in which the insertion portion 11b of the attachment leg 11 is inserted, is formed in each electrode land 22 and the circuit board 20. Similar to the electronic circuit module 100, the circuit board 20 includes the non-electrode portions 23 at locations at which the contact portions 11d of the attachment leg 11 come into contact with the circuit board 20. Owing to the non-electrode portions 23, the attachment leg 11 of the metal cover 10 does not come into direct contact with the electrode land 22 when the attachment leg 11 is attached to the circuit board 20.

In the electronic circuit module 110, the non-electrode portions 23 are formed by forming electrode-free portions 22a at a location near the outline of the electrode land 22, the electrode-free portions 22a being portions in which the electrode land 22 is absent. Therefore, similar to the electronic circuit module 100, as illustrated in FIG. 6, when the joining material layer 42 is formed on the electrode land 22, substantially no gaps remain in the spaces in the clearance portions 11c of the attachment leg 11 that are above the surface of the electrode land 22 and that have the space length L1. As a result, no pin holes are formed when the metal cover 10 is joined to the circuit board 20.

Second Modification of Electronic Circuit Module

Figure 7:
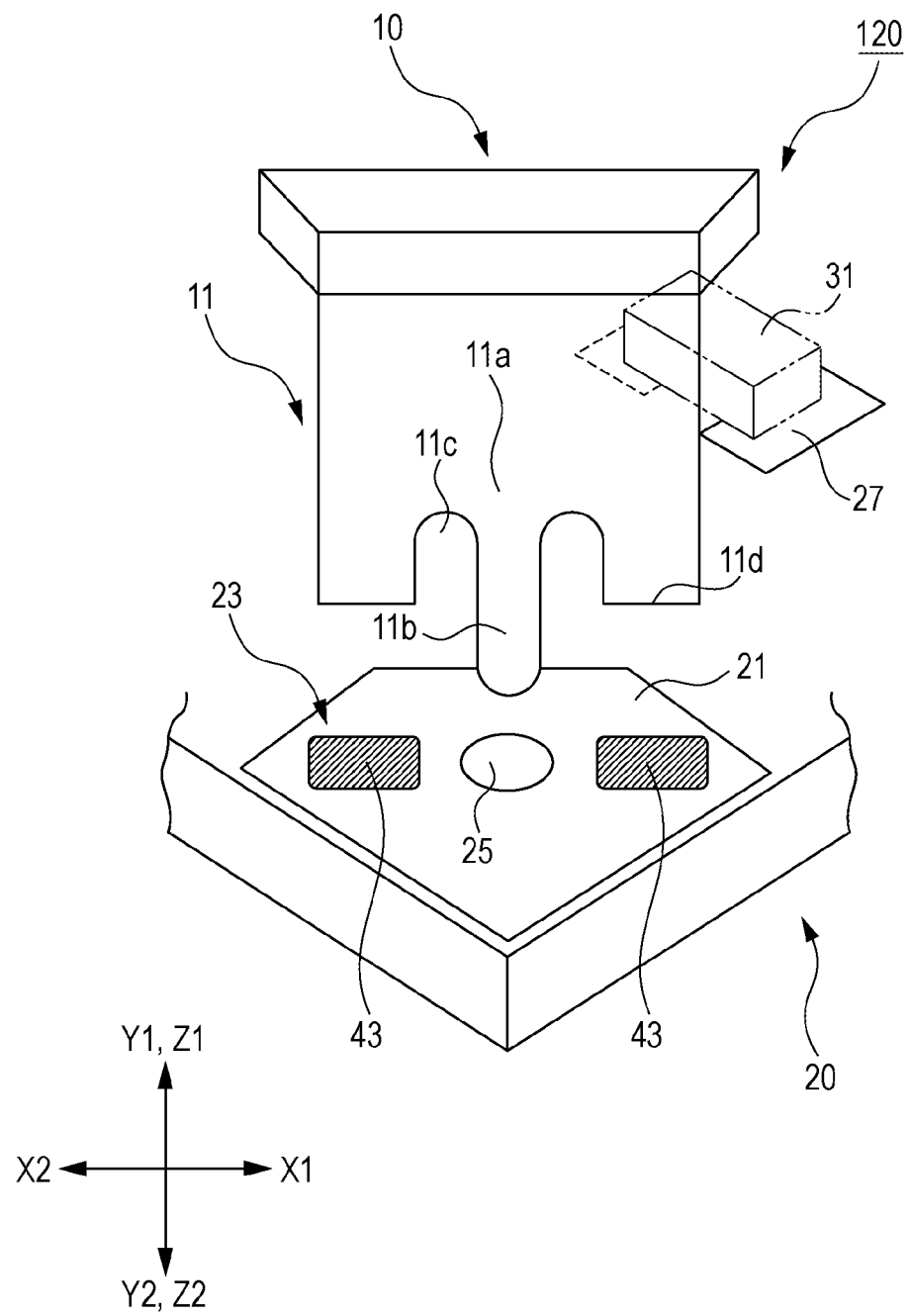
FIG. 7 is an enlarged schematic view of an electronic circuit module according to a second modification.

The structure of an electronic circuit module 120 will be described with reference to FIGS. 1, 2, 7, and 8. The electronic circuit module 120 is a second modification of the above-described electronic circuit module 100. FIG. 7 is an enlarged schematic view of the electronic circuit module 120, and FIG. 8 is an enlarged schematic view of the electronic circuit module 120 viewed along line A-A in FIG. 2 in the state after the joining material 41 is applied.

The only difference between the structure of the electronic circuit module 120 and the structure of the electronic circuit module 100 is the structure of the non-electrode portions 23. Therefore, the description of the components other than the non-electrode portions 23 will be omitted. The components are denoted by the same reference numerals as the components of the electronic circuit module 100.

Referring to FIGS. 1 and 2, the electrode lands 21 are provided on the circuit board 20, each electrode land 21 being joined to the corresponding one of the attachment legs 11 of the cover 10. The electrode lands 21 are located near the four corners of the circuit board 20 so that the metal cover 10 can be joined to the electrode lands 21 at the four corners thereof.

The insertion hole 25 in which the insertion portion 11b of the attachment leg 11 is inserted is formed in each electrode land 21 and the circuit board 20. Similar to the electronic circuit module 100, the circuit board 20 includes the non-electrode portions 23 at locations at which the contact portions 11d of the attachment leg 11 come into contact with the circuit board 20. Owing to the non-electrode portions 23, each attachment leg 11 of the metal cover 10 does not come into direct contact with the corresponding electrode land 21 when the attachment leg 11 is attached to the circuit board 20.

In the electronic circuit module 120, the non-electrode portions 23 are formed by applying a material 43 that is not wettable by the joining material to each electrode land 21. The material 43 that is not wettable by the joining material is applied in regions where the contact portions 11d of each attachment leg 11 are placed.

Also in the electronic circuit module 120, similar to the electronic circuit module 100, the joining material layer 42 is formed on each electrode land 21, as illustrated in FIG. 8. However, in the electronic circuit module 120, the joining material layer 42 includes a first joining material layer 42a and a second joining material layer 42b that are stacked together. More specifically, the joining material 41 is applied to the electrode land 21 twice. The joining material 41 may be, for example, solder, and the material 43 that is not wettable by the joining material may be, for example, a resist material (solder resist or the like). In the following description, the material 43 that is not wettable by the joining material will be referred to as a resist material 43.

Since the resist material 43 is applied to the electrode land 21, the joining material layer 42 is not formed on the resist material 43 when the joining material layer 42 is formed on the electrode land 21. Therefore, when the attachment leg 11 is mounted on the circuit board 20, the contact portions 11d of the attachment leg 11 are not placed on the joining material layer 42 formed on the electrode land 21.

In addition, since the joining material layer 42 includes the first joining material layer 42a and the second joining material layer 42b that are stacked together, substantially no gaps remain in the spaces in the clearance portions 11c of the attachment leg 11 that are above the surface of the electrode land 21 and that have the space length L1. As a result, no pin holes are formed when the metal cover 10 is joined to the circuit board 20.

First Embodiment of Cover-Fixing Method for Electronic Circuit Module

Figure 9A:
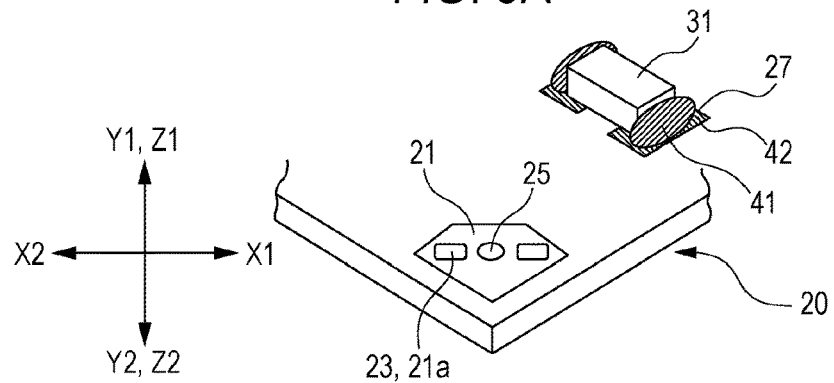
FIGS. 9A to 9C are schematic diagrams illustrating a first embodiment of a cover-fixing method for an electronic circuit module.
Figure 9B:
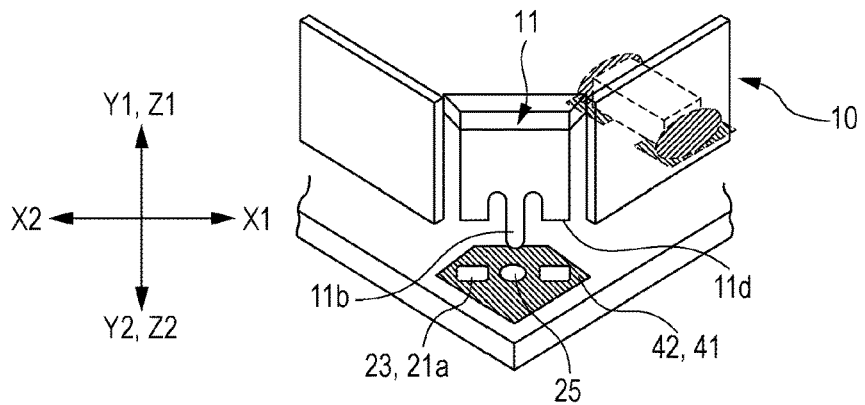
Figure 9C:
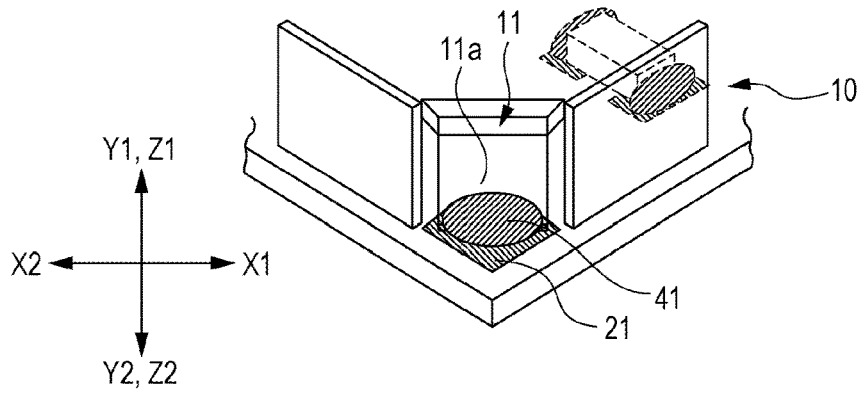

A first embodiment of a cover-fixing method for an electronic circuit module according to the present invention will be described with reference to FIGS. 1, 2, 3, 4 and 9A to 9C. FIGS. 9A to 9C are schematic diagrams illustrating the first embodiment of the cover-fixing method for the electronic circuit module viewed along line A-A in FIG. 2. FIG. 9A is a schematic diagram illustrating the state before first reflow in a mounting step. FIG. 9B is a schematic diagram illustrating the state before second reflow in an assembly step. FIG. 9C is a schematic diagram illustrating the state after the second reflow. FIG. 4 is an enlarged schematic view illustrating the state in which the joining material layer 42 is formed and the metal cover 10 is inserted before the second reflow.

The first embodiment of the cover-fixing method for the electronic circuit module is a cover-fixing method for the above-described electronic circuit module 100 by which the metal cover 10 illustrated in FIGS. 1 and 2, which covers the circuit board 20, is fixed to the circuit board 20. The electronic components 31 are mounted on the circuit board 20. The metal cover 10 includes the top plate 13 that opposes the circuit board 20, and the attachment legs 11 that extend from the top plate 13 and that are joined to the circuit board 20.

The electrode lands 21, each of which is joined to the corresponding one of the attachment legs 11, are provided on the circuit board 20. As illustrated in FIG. 3, each attachment leg 11 includes the fixing portion 11a joined to the corresponding electrode land 21; the insertion portion 11b that extends so as to project from the fixing portion 11a; the clearance portions 11c provided near the base of the insertion portion 11b; and the contact portions 11d that come into contact with the surface of the circuit board 20.

The insertion hole 25 in which the insertion portion 11b of the attachment leg 11 is inserted is formed in each electrode land 21 and the circuit board 20. The circuit board 20 includes the non-electrode portions 23 at locations at which the contact portions 11d come into contact with the circuit board 20. The non-electrode portions 23 are formed by forming electrode-free portions 21a in the electrode land 21, the electrode-free portions 21a being portions in which the electrode land 21 is absent.

The first embodiment of the cover-fixing method for the electronic circuit module includes a mounting step for mounting the electronic components 31 and an assembly step, which is performed after the mounting step, for attaching the metal cover 10. The first reflow is performed in the mounting step, and the second reflow is performed in the assembly step. Thus, reflow is performed twice.

In the mounting step, as illustrated in FIG. 9A, the circuit board 20 is prepared, and the joining material 41 is applied to the component lands 27 for the electronic component 31 to form the joining material layer 42. At this time, the joining material layer 42 is not formed on the electrode land 21. Then, the electronic component 31 is mounted on the component lands 27, and first reflow is performed to fix the electronic component 31. The application of the joining material 41 before the first reflow is performed by screen printing. Solder, for example, is used as the joining material 41.

Next, as illustrated in FIG. 9B, before the second reflow in the assembly step, the joining material 41 is applied to the electrode land 21 to form the joining material layer 42, and then the insertion portion 11b of the attachment leg 11 is inserted into the insertion hole 25. At this time, the joining material layer 42 is not formed on the electrode-free portions 21a, which serve as the non-electrode portions 23. The application of the joining material 41, that is, formation of the joining material layer 42, before the second reflow is performed not by screen printing but by using a dispenser. Instead of inserting the insertion portion 11b of the attachment leg 11 into the insertion hole 25 after forming the joining material layer 42 on the electrode land 21, the joining material layer 42 may be formed by applying the joining material 41 to the electrode land 21 after inserting the insertion portion 11b of the attachment leg 11 into the insertion hole 25.

In the state in which the joining material layer 42 is formed and the insertion portion 11b of the attachment leg 11 is inserted in the insertion hole 25 as illustrated in FIG. 4, the contact portions 11d of the attachment leg 11 are placed on the circuit board 20 without being in contact with the electrode land 21. In addition, each of the clearance portions 11c of the attachment leg 11 accommodates a portion of the electrode land 21 that is adjacent to the insertion hole 25, and the joining material layer 42 is formed on this portion of the electrode land 21. Each of the regions near the outer end portions of the attachment leg 11 at the left side (X2-side) and the right side (X1-side) includes a portion of the electrode land 21 at a side opposite to the insertion hole 25, and the joining material layer 42 is also formed on this portion of the electrode land 21.

Subsequently, as illustrated in FIG. 9C, the second reflow is performed in the assembly step to join the fixing portion 11a of the attachment leg 11 and the electrode land 21 together with the joining material 41. At this time, the joining material 41 that forms the joining material layer 42 in the clearance portions 11c of the attachment leg 11 illustrated in FIG. 4 is melted so as to fill the clearance portions 11c of the attachment leg 11, and is joined to the fixing portion 11a. In addition, the joining material 41 that forms the joining material layer 42 near the outer end portions of the attachment leg 11 at the left and right sides is also melted on the outer end portions of the attachment leg 11 at the left and right sides, and is joined to the fixing portion 11a. As a result, as illustrated in FIG. 1, the metal cover 10 is fixed to the circuit board 20.

Second Embodiment of Cover-Fixing Method for Electronic Circuit Module

Figure 10A:
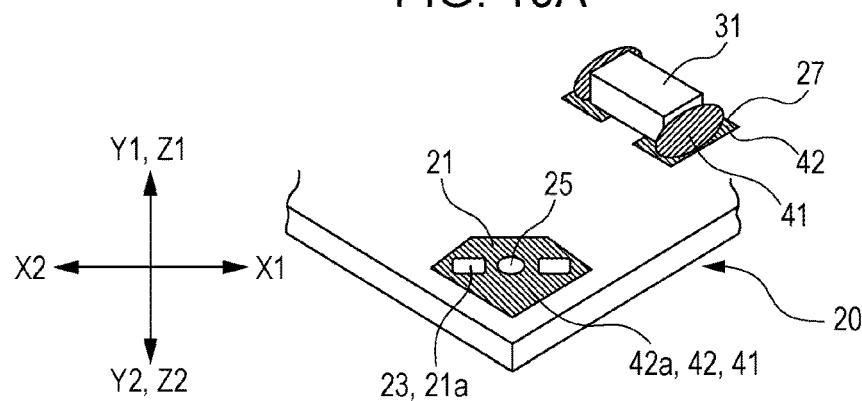
FIGS. 10A to 10C are schematic diagrams illustrating a second embodiment of a cover-fixing method for an electronic circuit module.
Figure 10B:
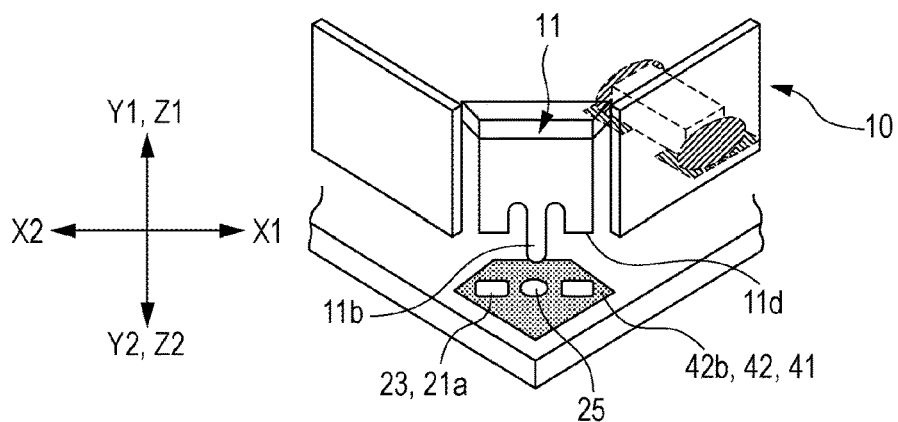
Figure 10C:
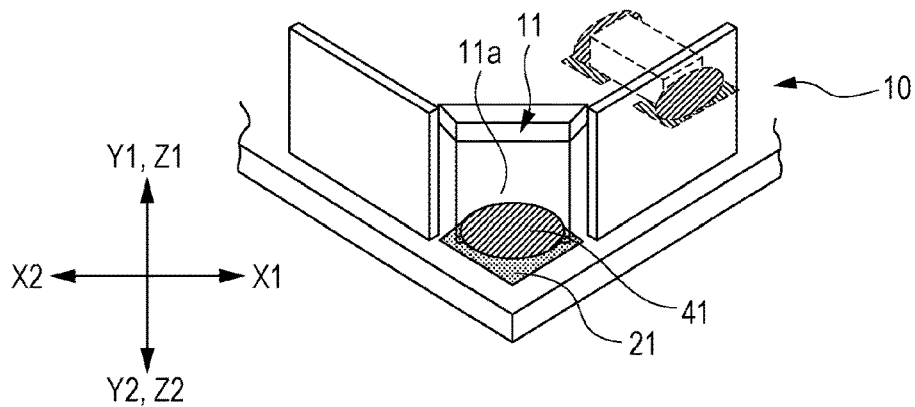
Figure 11:
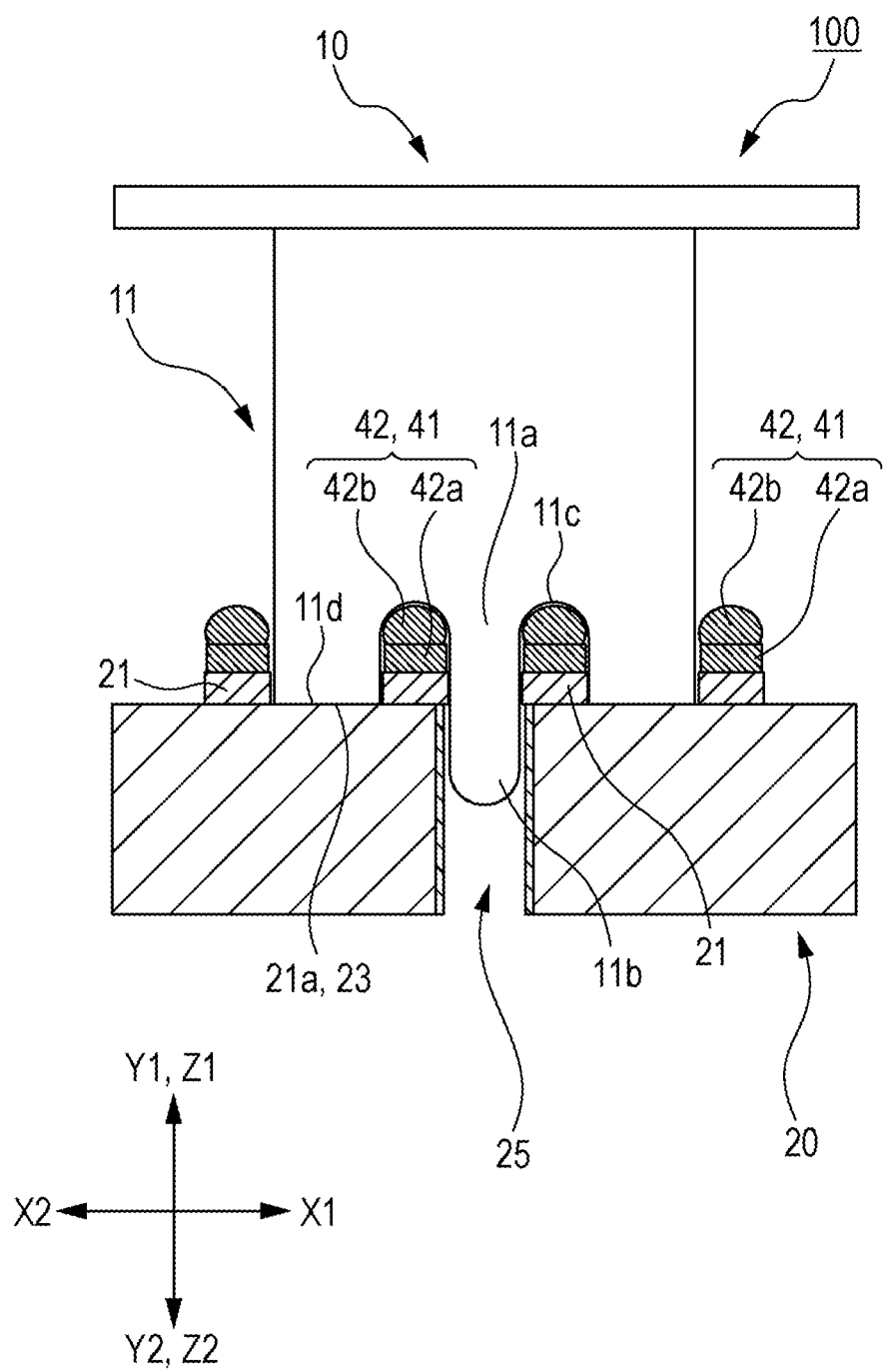
FIG. 11 is a schematic diagram illustrating the state after an application of a joining material according to the second embodiment.

A second embodiment of a cover-fixing method for an electronic circuit module according to the present invention will be described with reference to FIGS. 1, 2, 3, 10A to 10C, and 11. FIGS. 10A to 10C are schematic diagrams illustrating the second embodiment of the cover-fixing method for the electronic circuit module viewed along line A-A in FIG. 2. FIG. 10A is a schematic diagram illustrating the state before first reflow in a mounting step. FIG. 10B is a schematic diagram illustrating the state before second reflow in an assembly step. FIG. 10C is a schematic diagram illustrating the state after the second reflow. FIG. 11 is an enlarged schematic view illustrating the state in which the joining material layer 42 is formed and the metal cover 10 is inserted before the second reflow.

The second embodiment of the cover-fixing method for the electronic circuit module is a cover-fixing method for the above-described electronic circuit module 100 that differs from the first embodiment of the cover-fixing method and by which the metal cover 10 illustrated in FIGS. 1 and 2, which covers the circuit board 20, is fixed to the circuit board 20. The electronic components 31 are mounted on the circuit board 20. The structures of the metal cover 10 and the circuit board 20 are the same as those in the first embodiment of the cover-fixing method for the electronic circuit module, and the description thereof will thus be omitted.

The second embodiment of the cover-fixing method for the electronic circuit module includes a mounting step for mounting the electronic components 31 and an assembly step, which is performed after the mounting step, for attaching the metal cover 10. The first reflow is performed in the mounting step, and the second reflow is performed in the assembly step. Thus, reflow is performed twice.

In the mounting step, as illustrated in FIG. 10A, the circuit board 20 is prepared, and the joining material layer 42 is formed on the component lands 27 for the electronic component 31 by applying the joining material 41 to the component lands 27. The joining material layer 42 is also formed on the electrode land 21. The joining material layer 42 formed on the electrode land 21 is the first joining material layer 42a. At this time, the joining material layer 42 is not formed on the electrode-free portions 21a, which serve as the non-electrode portions 23. The application of the joining material 41 before the first reflow is performed by screen printing. Subsequently, the electronic component 31 is mounted on the component lands 27, and the first reflow is performed to fix the electronic component 31. More specifically, the joining material layer 42 is simultaneously formed on the component lands 27 for the electronic component 31 and on the electrode land 21, and then the electronic component 31 is mounted. Solder, for example, is used as the joining material 41.

Next, in the assembly step, as illustrated in FIG. 10B, the joining material 41 is additionally applied to the electrode land 21 so as to form a second joining material layer 42. Subsequently, the insertion portion 11b of the attachment leg 11 is inserted into the insertion hole 25. The joining material layer 42 formed at this time is the second joining material layer 42b. More specifically, as illustrated in FIG. 11, the joining material layer 42 in which the first joining material layer 42a formed before the first reflow and the second joining material layer 42b formed before the second reflow are stacked is formed on the electrode land 21. The application of the joining material 41 before the second reflow, that is, the formation of the second joining material layer 42b, is performed not by screen printing but by using a dispenser. Similar to the first embodiment of the cover-fixing method, the joining material layer 42 may instead be formed by applying the joining material 41 to the electrode land 21 after inserting the insertion portion 11b of the attachment leg 11 into the insertion hole 25.

In the state in which the joining material layer 42 is formed and the insertion portion 11b of the attachment leg 11 is inserted in the insertion hole 25 as illustrated in FIG. 11, the contact portions 11d of the attachment leg 11 are placed on the circuit board 20 without being in contact with the electrode land 21. In addition, each of the clearance portions 11c of the attachment leg 11 accommodates a portion of the electrode land 21 that is adjacent to the insertion hole 25, and the joining material layer 42, which includes the first joining material layer 42a and the second joining material layer 42b, is formed on this portion of the electrode land 21. Each of the regions near the outer end portions of the attachment leg 11 at the left side (X2-side) and the right side (X1-side) includes a portion of the electrode land 21 at a side opposite to the insertion hole 25, and a similar joining material layer 42 is also formed on this portion of the electrode land 21.

Subsequently, as illustrated in FIG. 10C, the second reflow is performed in the assembly step to join the fixing portion 11a of the attachment leg 11 and the electrode land 21 together with the joining material 41. At this time, the joining material 41 that forms the joining material layer 42 in the clearance portions 11c of the attachment leg 11 illustrated in FIG. 11 is melted so as to fill the clearance portions 11c of the attachment leg 11, and is joined to the fixing portion 11a. In addition, the joining material 41 that forms the joining material layer 42 near the outer end portions of the attachment leg 11 at the left and right sides is also melted on the outer end portions of the attachment leg 11 at the left and right sides, and is joined to the fixing portion 11a. As a result, as illustrated in FIG. 1, the metal cover 10 is fixed to the circuit board 20.

Third Embodiment of Cover-Fixing Method for Electronic Circuit Module

Figure 12A:
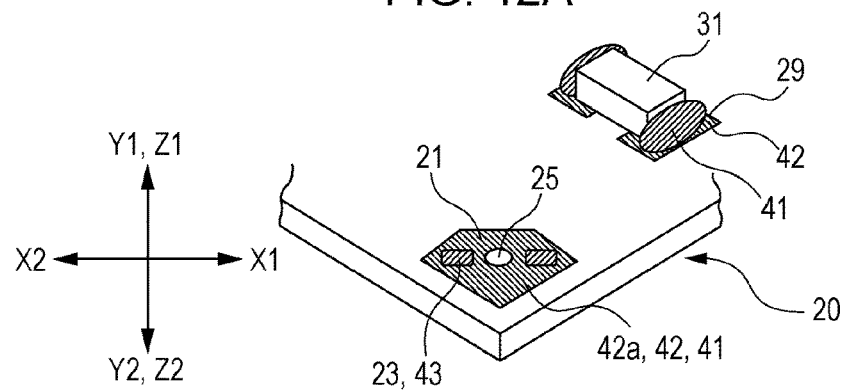
FIGS. 12A to 12C are schematic diagrams illustrating a cover-fixing method for an electronic circuit module according to a third embodiment.
Figure 12B:
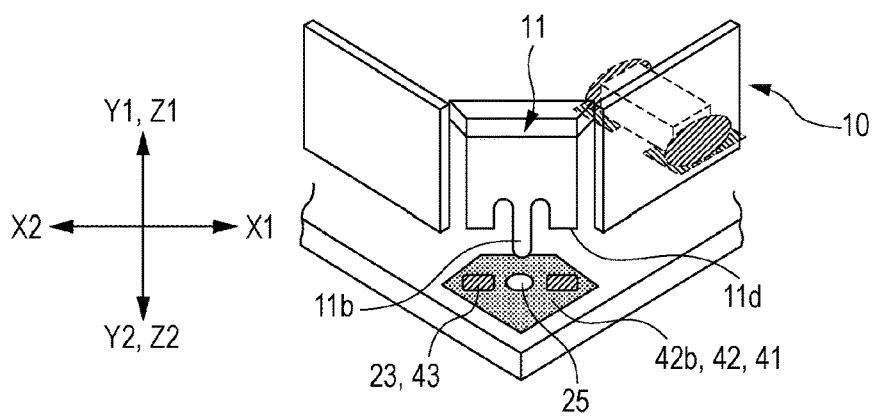
Figure 12C:
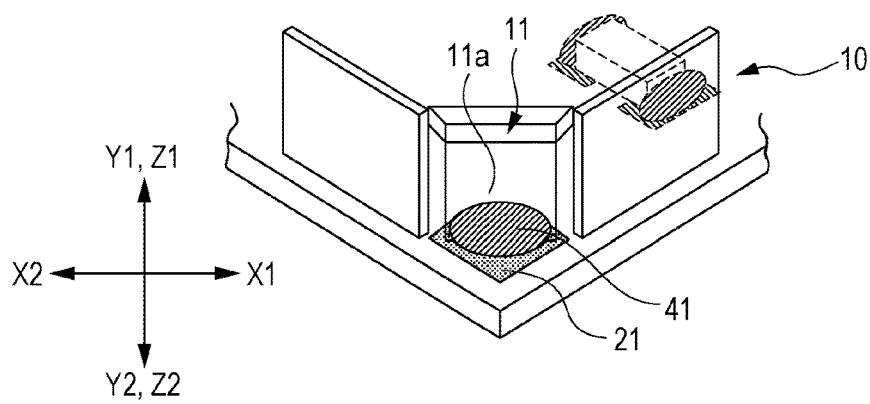
Figure 13:
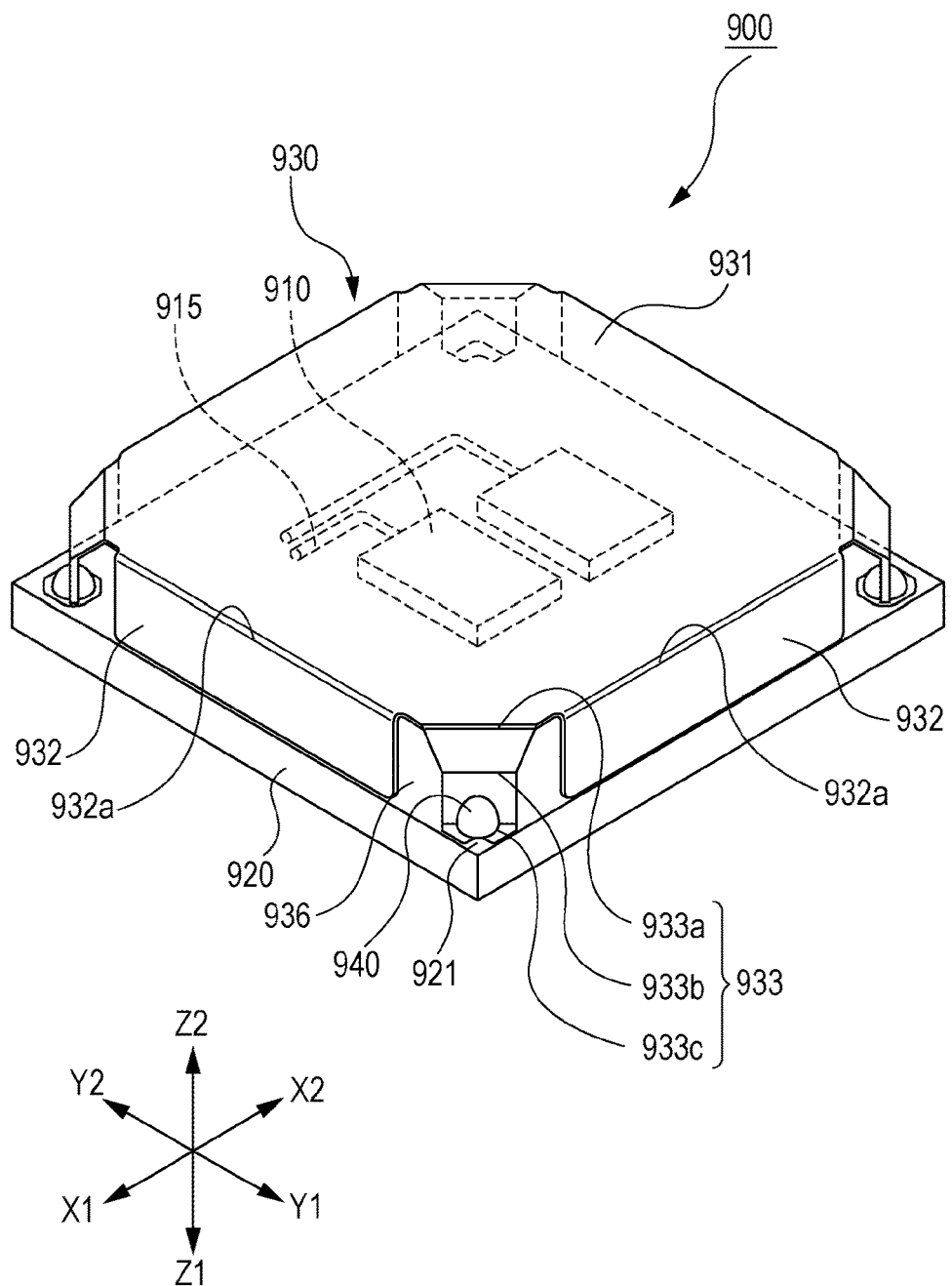
FIG. 13 is a perspective view illustrating the external appearance of an electronic circuit module according to the related art.
Figure 14A:
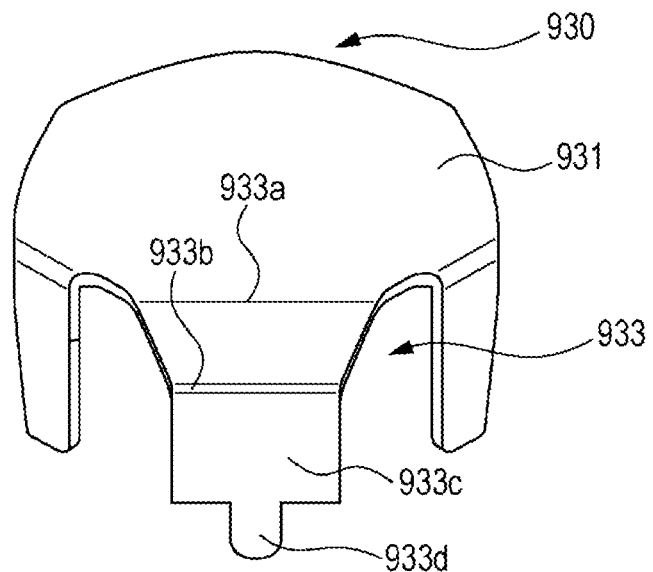
FIGS. 14A and 14B are perspective views of a metal cover included in the electronic circuit module according to the related art.
Figure 14B:
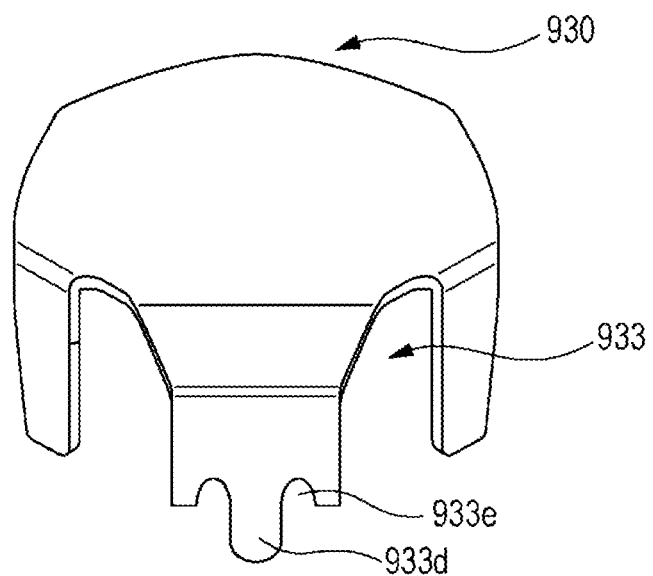

A third embodiment of a cover-fixing method for an electronic circuit module according to the present invention will be described with reference to FIGS. 1, 2, 7, 8, and 12A to 12C. FIGS. 12A to 12C are schematic diagrams illustrating the third embodiment of the cover-fixing method for the electronic circuit module viewed along line A-A in FIG. 2. FIG. 12A is a schematic diagram illustrating the state before first reflow in a mounting step. FIG. 12B is a schematic diagram illustrating the state before second reflow in an assembly step. FIG. 12C is a schematic diagram illustrating the state after the second reflow. FIG. 8 is an enlarged schematic view illustrating the state in which the joining material layer 42 is formed and the metal cover 10 is inserted before the second reflow.

The third embodiment of the cover-fixing method for the electronic circuit module is a cover-fixing method for the electronic circuit module 120 by which the metal cover 10 illustrated in FIGS. 1 and 2, which covers the circuit board 20, is fixed to the circuit board 20. The electronic components 31 are mounted on the circuit board 20. The electronic circuit module 120 is the second modification of the above-described electronic circuit module 100. The structure of the metal cover 10 is the same as that in the first embodiment of the cover-fixing method for the electronic circuit module, and the description thereof will thus be omitted.

The electrode lands 21, each of which is joined to the corresponding one of the attachment legs 11, are provided on the circuit board 20. As illustrated in FIG. 7, the insertion hole 25 in which the insertion portion 11b of the attachment leg 11 is inserted is formed in each electrode land 21 and the circuit board 20. The circuit board 20 includes the non-electrode portions 23 at locations at which the contact portions 11d come into contact with the circuit board 20.

In the electronic circuit module 120, the non-electrode portions 23 are formed by applying the resist material 43 to the electrode land 21. As illustrated in FIG. 8, the resist material 43 is applied to the electrode land 21 to a predetermined thickness D1 at locations at which the contact portions 11d come into contact with the electrode land 21.

Also in the third embodiment of the cover-fixing method for the electronic circuit module, similar to the second embodiment of the cover-fixing method for the electronic circuit module, the joining material layer 42 includes the first joining material layer 42a and the second joining material layer 42b, as illustrated in FIG. 8. In other words, the joining material 41, such as solder, is applied to the electrode land 21 twice.

The third embodiment of the cover-fixing method for the electronic circuit module also includes a mounting step for mounting the electronic components 31 and an assembly step, which is performed after the mounting step, for attaching the metal cover 10. The first reflow is performed in the mounting step, and the second reflow is performed in the assembly step. Thus, reflow is performed twice.

In the mounting step, as illustrated in FIG. 12A, the circuit board 20 is prepared, and the joining material layer 42 is formed on the component lands 27 for the electronic component 31 by applying the joining material 41 to the component lands 27. The joining material layer 42 is also formed on the electrode land 21. The joining material layer 42 formed on the electrode land 21 is the first joining material layer 42a. The first joining material layer 42a is formed so that the thickness thereof is greater than the predetermined thickness D1 of the resist material 43. The application of the joining material 41 before the first reflow is performed by screen printing. At this time, the first joining material layer 42a is not formed at the locations at which the resist material 43, which forms the non-electrode portions 23, is applied.

Subsequently, the electronic component 31 is mounted on the component lands 27, and the first reflow is performed to fix the electronic component 31. More specifically, the joining material layer 42 is simultaneously formed on the component lands 27 for the electronic component 31 and on the electrode land 21, and then the electronic component 31 is mounted.

Next, in the assembly step, as illustrated in FIG. 12B, the joining material 41 is additionally applied to the electrode land 21 so as to form the joining material layer 42. Subsequently, the insertion portion 11b of the attachment leg 11 is inserted into the insertion hole 25. The joining material layer 42 formed on the electrode land 21 at this time is the second joining material layer 42b. More specifically, as illustrated in FIG. 8, the joining material layer 42 in which the first joining material layer 42a formed before the first reflow and the second joining material layer 42b formed before the second reflow are stacked is formed on the electrode land 21. The application of the joining material 41 before the second reflow, that is, the formation of the second joining material layer 42b, is performed not by screen printing but by using a dispenser. Similar to the first embodiment of the cover-fixing method, the joining material layer 42 may instead be formed by applying the joining material 41 to the electrode land 21 after inserting the insertion portion 11b of the attachment leg 11 into the insertion hole 25.

In the state in which the joining material layer 42 is formed and the insertion portion 11b of the attachment leg 11 is inserted in the insertion hole 25 as illustrated in FIG. 8, the contact portions 11d of the attachment leg 11 are placed on the circuit board 20 without being in contact with the electrode land 21. In addition, each of the clearance portions 11c of the attachment leg 11 accommodates a portion of the electrode land 21 that is adjacent to the insertion hole 25, and the joining material layer 42, which includes the first joining material layer 42a and the second joining material layer 42b, is formed on this portion of the electrode land 21. Each of the regions near the outer end portions of the attachment leg 11 at the left side (X2-side) and the right side (X1-side) includes a portion of the electrode land 21 at a side opposite to the insertion hole 25 and a similar joining material layer 42 is also formed on this portion of the electrode land 21.

Subsequently, as illustrated in FIG. 12C, the second reflow is performed in the assembly step to join the fixing portion 11a of the attachment leg 11 and the electrode land 21 together with the joining material 41. At this time, the joining material 41 that forms the joining material layer 42 in the clearance portions 11c of the attachment leg 11 illustrated in FIG. 8 is melted so as to fill the clearance portions 11c of the attachment leg 11, and is joined to the fixing portion 11a. In addition, the joining material 41 that forms the joining material layer 42 near the outer end portions of the attachment leg 11 at the left and right sides is also melted on the outer end portions of the attachment leg 11 at the left and right sides, and is joined to the fixing portion 11a. As a result, as illustrated in FIG. 1, the metal cover 10 is fixed to the circuit board 20.

The effects of the embodiments of the present invention will now be described.

In the electronic circuit module 100 according to the present invention, since each attachment leg 11 has the clearance portions 11c, rising of the metal cover 10 can be prevented. In addition, since the non-electrode portions 23 are provided at the locations at which each attachment leg 11 comes into contact with the corresponding electrode land 21 and the joining material layer 42 is formed on the electrode land 21, the gaps in the clearance portions 11c can be reduced in size and can be filled with the joining material 41 that forms the joining material layer 42. Therefore, the occurrence of pin holes can be reduced when the metal cover 10 and the circuit board 20 are joined together. As a result, the metal cover 10 can be fixed to the circuit board 20 with predetermined joining strength.

In addition, the surface of each electrode land 21 can be made relatively high since the electrode-free portions 21a, in which the electrode land 21 is absent, are formed. Therefore, the size of the spaces in the clearance portions 11c of the attachment leg 11 in the region above the surface of the electrode land 21 can be reduced. As a result, the occurrence of pin holes can be further reduced when the metal cover 10 and the circuit board 20 are joined together. Furthermore, the size of each electrode land 21 can be increased since the electrode-free portions 21a are formed in the electrode land 21. Accordingly, the metal cover 10 can be more stably joined to the circuit board 20.

In the electronic circuit module 110 according to the first modification of the present invention, the surface of each electrode land 22 can be made relatively high since the electrode-free portions 22a, in which the electrode land 22 is absent, are formed. Therefore, the size of the spaces in the clearance portions 11c of the attachment leg 11 in the region above the surface of the electrode land 22 can be reduced. As a result, the occurrence of pin holes can be further reduced when the metal cover 10 and the circuit board 20 are joined together. Furthermore, since the electrode-free portions 22a are provided near the outline of each electrode land 22, the metal cover 10 can be stably joined to the circuit board 20 even in narrow areas, such as the corners of the circuit board 20 or areas in which a conductive portion is located near the electrode land 22.

In the electronic circuit module 120 according to the second modification of the present invention, the resist material 43 is applied so that the joining material 41 is not provided thereon. Therefore, the size of the gaps in the clearance portions 11c of each attachment leg 11 can be easily reduced by adjusting the thickness of the joining material layer 42 in the surrounding regions.

According to the first embodiment of the cover-fixing method for the electronic circuit module, since each attachment leg 11 has the clearance portions 11c, rising of the metal cover 10 can be prevented. In addition, since the non-electrode portions 23 are provided at the locations at which each attachment leg 11 comes into contact with the corresponding electrode land 21 and the joining material layer 42 is formed on the electrode land 21, the gaps in the clearance portions 11c can be reduced in size and can be filled with the joining material 41 that forms the joining material layer 42. Therefore, the occurrence of pin holes can be reduced when the metal cover 10 and the circuit board 20 are joined together. As a result, the metal cover 10 can be fixed to the circuit board 20 with predetermined joining strength.

According to the second embodiment of the cover-fixing method for the electronic circuit module, since each attachment leg 11 has the clearance portions 11c, rising of the metal cover 10 can be prevented. In addition, since the non-electrode portions 23 are provided at the locations at which each attachment leg 11 comes into contact with the corresponding electrode land 21 and the joining material layer 42 is formed on the electrode land 21, the gaps in the clearance portions 11c can be reduced in size and can be filled with the joining material 41 that forms the joining material layer 42. Therefore, the occurrence of pin holes can be reduced when the metal cover 10 and the circuit board 20 are joined together. As a result, the metal cover 10 can be fixed to the circuit board 20 with predetermined joining strength. In addition, since the reflow joining process is performed twice, the joining material 41 is applied to each electrode land 21 before the first reflow, so that oxidation of the electrode land 21 can be prevented. As a result, the joining strength can be further increased.

According to the third embodiment of the cover-fixing method for the electronic circuit module, since each attachment leg 11 has the clearance portions 11c, rising of the metal cover 10 can be prevented. In addition, since the reflow joining process is performed twice, the joining material 41 is applied to each electrode land 21 before the first reflow, so that oxidation of the electrode land 21 can be prevented. As a result, the joining strength can be further increased. Furthermore, the resist material 43 is applied so that the joining material 41 is not provided thereon. Therefore, the size of the gaps in the clearance portions 11c of each attachment leg 11 can be easily reduced by adjusting the thickness of the joining material layer 42 in the surrounding regions.

As described above, according to the electronic circuit module and the cover-fixing method for the electronic circuit module according to the present invention, since each attachment leg has the clearance portions, rising of the metal cover can be prevented. In addition, since the non-electrode portions are provided at the locations at which each attachment leg comes into contact with the corresponding electrode land and the joining material layer is formed on the electrode land, the gaps in the clearance portions can be reduced in size and can be filled with the joining material that forms the joining material layer. Therefore, the occurrence of pin holes can be reduced when the metal cover and the circuit board are joined together. As a result, the metal cover can be fixed to the circuit board with predetermined joining strength.

The present invention is not limited to the above-described embodiments, and various changes can be made without departing from the gist of the present invention.

What is claimed is:

1. An electronic circuit module comprising:
a circuit board having an electronic component mounted thereon; and
a metal cover that covers the circuit board,
wherein the metal cover includes:
a top plate that opposes the circuit board, and
a plurality of attachment legs that extend from the top plate and that are joined to the circuit board,
wherein a plurality of electrode lands are provided on the circuit board, each of the electrode lands being joined to a corresponding one of the attachment legs,
wherein each of the attachment legs includes:
a fixing portion joined to a corresponding one of the electrode lands,
an insertion portion that extends so as to project from the fixing portion,
a clearance portion provided near a base of the insertion portion, and
a contact portion that is in contact with a surface of the circuit board,
wherein an insertion hole in which the insertion portion is inserted is provided in each of the electrode lands and in the circuit board, and
wherein the circuit board includes a non-electrode portion at a location at which the contact portion is in contact with the circuit board; and
wherein the non-electrode portion comprises an electrode-free portion of a corresponding one of the electrode lands, the electrode-free portion being a portion in which the corresponding one of the electrode lands is absent.

2. The electronic circuit module according to claim 1, the electrode-free portion is provided in the corresponding one of the electrode lands.

3. The electronic circuit module according to claim 1, wherein the electrode-free portion is provided so as to extend from the outer periphery to the inside of the corresponding one of the electrode lands.

* * * * *